United States Patent
Khlat et al.

(10) Patent No.: US 10,069,470 B2
(45) Date of Patent: Sep. 4, 2018

(54) MULTI-MODE ENVELOPE TRACKING AMPLIFIER CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/459,449

(22) Filed: Mar. 15, 2017

(65) Prior Publication Data
US 2018/0048276 A1    Feb. 15, 2018

Related U.S. Application Data

(60) Provisional application No. 62/374,306, filed on Aug. 12, 2016, provisional application No. 62/383,080, filed on Sep. 2, 2016.

(51) Int. Cl.
*H03G 3/30* (2006.01)
*H03F 3/19* (2006.01)
*H03F 3/45* (2006.01)

(52) U.S. Cl.
CPC ............ *H03G 3/3036* (2013.01); *H03F 3/19* (2013.01); *H03F 3/45475* (2013.01); *H03F 2200/102* (2013.01); *H03F 2200/351* (2013.01); *H03F 2200/451* (2013.01)

(58) Field of Classification Search
CPC ............................ H03G 3/3036; H03F 3/19
See application file for complete search history.

(56) References Cited

U.S. PATENT DOCUMENTS

| | | | |
|---|---|---|---|
| 9,041,365 B2* | 5/2015 | Kay | G05F 1/468 323/268 |
| 9,098,099 B2 | 8/2015 | Park et al. | |
| 9,288,098 B2 | 3/2016 | Yan et al. | |
| 9,520,907 B2 | 12/2016 | Peng et al. | |
| 9,748,845 B1* | 8/2017 | Kotikalapoodi | H02M 3/1584 |
| 2012/0194274 A1* | 8/2012 | Fowers | H03F 1/0238 330/293 |

(Continued)

OTHER PUBLICATIONS

Non-Final Office Action for U.S. Appl. No. 15/792,909, dated May 18, 2018, 13 pages.

*Primary Examiner* — Patricia T Nguyen
(74) *Attorney, Agent, or Firm* — Withrow & Terranova, P.L.L.C.

(57) ABSTRACT

A multi-mode envelope tracking (ET) amplifier circuit is provided. The multi-mode ET amplifier circuit can operate in low-resource block (RB) mode and high-RB mode. The multi-mode ET amplifier circuit includes an ET amplifier(s) to amplify a radio frequency (RF) signal(s) to an amplified voltage, low-RB switcher circuitry to generate a direct current (DC) current, and high-RB switcher circuitry to generate an alternating current (AC) current. The amplified voltage, the DC current, and the AC current collectively cause the RF signal to be transmitted at a determined power. A control circuit(s) activates the high-RB switcher circuitry in the high-RB mode to provide the AC current, thus minimizing AC current sourced from the ET amplifier(s). As a result, it is possible to improve efficiency of the ET amplifier(s) and the multi-mode ET amplifier circuit in the high-RB mode and the low-RB mode.

21 Claims, 6 Drawing Sheets

(56) References Cited

U.S. PATENT DOCUMENTS

| | | |
|---|---|---|
| 2013/0021827 A1* | 1/2013 | Ye .......................... H03F 1/025 |
| | | 363/17 |
| 2014/0009226 A1* | 1/2014 | Severson ................. H03F 3/68 |
| | | 330/124 R |
| 2014/0155002 A1 | 6/2014 | Dakshinamurthy et al. |
| 2014/0210550 A1* | 7/2014 | Mathe ................... H03F 1/0238 |
| | | 330/131 |
| 2015/0280652 A1 | 10/2015 | Cohen |
| 2016/0105151 A1* | 4/2016 | Langer ................. H03F 1/0227 |
| | | 330/295 |
| 2016/0118941 A1 | 4/2016 | Wang |
| 2016/0197627 A1 | 7/2016 | Qin et al. |
| 2017/0317913 A1 | 11/2017 | Kim et al. |

\* cited by examiner

MULTI-MODE ENVELOPE TRACKING AMPLIFIER CIRCUIT

RELATED APPLICATIONS

This application claims the benefit of U.S. Provisional Patent Application Ser. No. 62/374,306, filed on Aug. 12, 2016, and U.S. Provisional Patent Application Ser. No. 62/383,080, filed on Sep. 2, 2016, which are incorporated herein by reference in their entireties.

FIELD OF THE DISCLOSURE

The technology of the disclosure relates generally to power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rate offered by wireless communication technologies, such as long-term evolution (LTE). To achieve the higher data rate in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the PAs are operating at a higher efficiency for a given instantaneous output power requirement of the RF signals. In addition, it can help to further improve efficiency of the PAs by minimizing electrical currents sourced from the PAs.

SUMMARY

Aspects disclosed in the detailed description include a multi-mode envelope tracking (ET) amplifier circuit. The multi-mode ET amplifier circuit can operate in a low-resource block (RB) mode and a high-RB mode. The multi-mode ET amplifier circuit includes an ET amplifier(s) to amplify a radio frequency (RF) signal(s) to an amplified voltage, low-RB switcher circuitry to generate a direct current (DC) current, and high-RB switcher circuitry to generate an alternating current (AC) current. The amplified voltage, the DC current, and the AC current collectively cause the RF signal to be transmitted at a determined power. A control circuit(s) activates the high-RB switcher circuitry in the high-RB mode to provide the AC current, thus minimizing AC current sourced from the ET amplifier(s). As a result, it is possible to improve efficiency of the ET amplifier(s) and the multi-mode ET amplifier circuit in the high-RB mode and the low-RB mode.

In one aspect, a multi-mode ET amplifier circuit is provided. The multi-mode ET amplifier circuit is configured to operate in a low-RB mode and a high-RB mode. The multi-mode ET amplifier circuit includes a signal output coupled to an RF transmission circuit for transmitting an RF signal at a determined power. The multi-mode ET amplifier circuit also includes at least one ET amplifier comprising an amplifier input configured to receive the RF signal and an amplifier output coupled to the signal output. The at least one ET amplifier is configured to amplify the RF signal to an amplified voltage at the amplifier output based on a supply voltage. The multi-mode ET amplifier circuit also includes low-RB switcher circuitry configured to generate a DC current. The multi-mode ET amplifier circuit also includes high-RB switcher circuitry configured to generate an AC current. The multi-mode ET amplifier circuit also includes at least one control circuit. The at least one control circuit is configured to activate the low-RB switcher circuitry in the low-RB mode and the high-RB mode to provide the DC current to the signal output. The at least one control circuit is also configured to activate the high-RB switcher circuitry in the high-RB mode to provide the AC current to the amplifier output. The at least one control circuit is also configured to deactivate the high-RB switcher circuitry in the low-RB mode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Aspects disclosed in the detailed description include a multi-mode envelope tracking (ET) amplifier circuit. The multi-mode ET amplifier circuit can operate in a low-resource block (RB) mode and a high-RB mode. The multi-mode ET amplifier circuit includes an ET amplifier(s) to amplify a radio frequency (RF) signal(s) to an amplified voltage, low-RB switcher circuitry to generate a direct current (DC) current, and high-RB switcher circuitry to generate an alternating current (AC) current. The amplified voltage, the DC current, and the AC current collectively cause the RF signal to be transmitted at a determined power. A control circuit(s) activates the high-RB switcher circuitry in the high-RB mode to provide the AC current, thus minimizing AC current sourced from the ET amplifier(s). As a result, it is possible to improve efficiency of the ET amplifier(s) and the multi-mode ET amplifier circuit in the high-RB mode and the low-RB mode.

Figure 1:
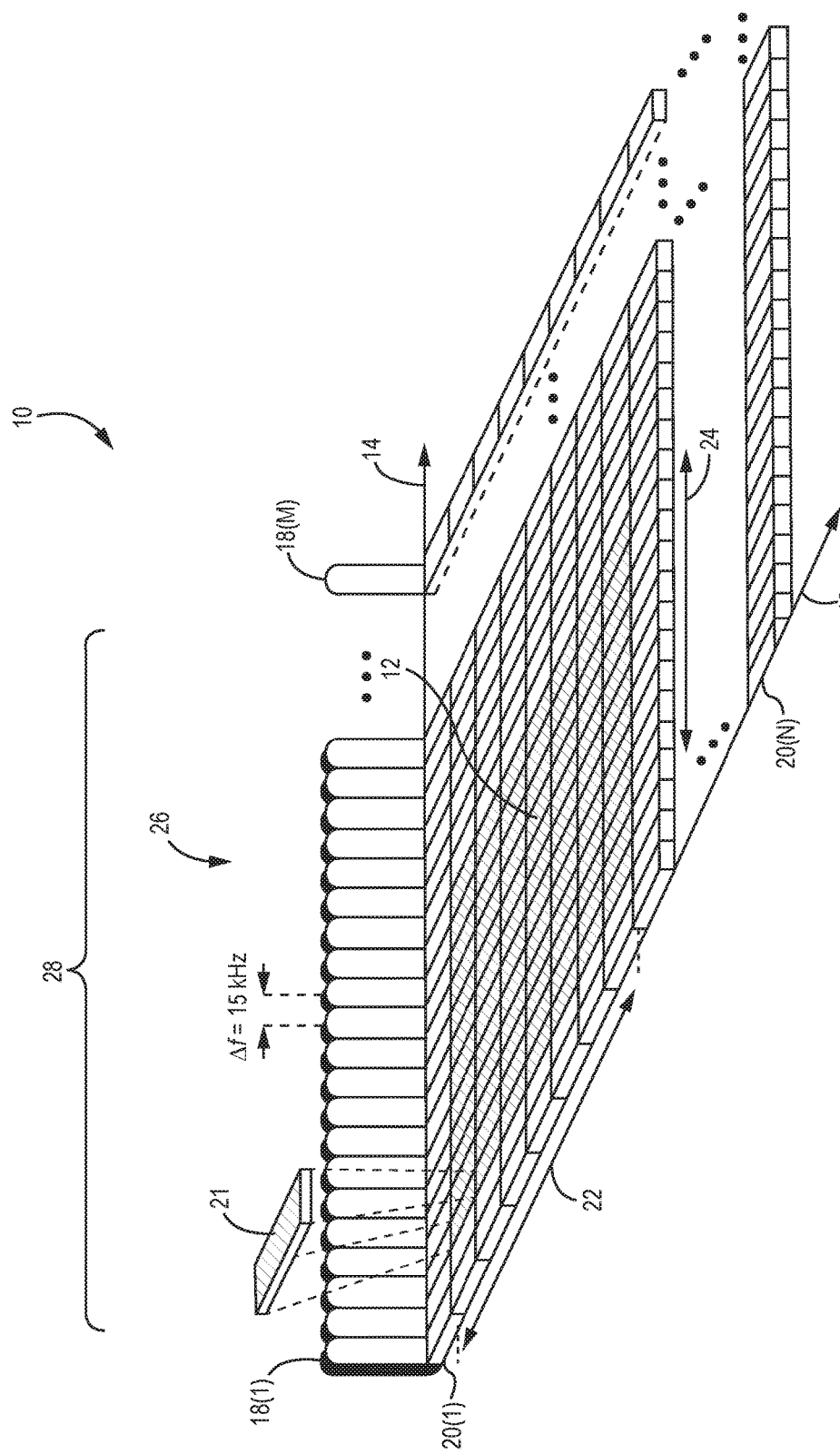
FIG. 1 is a schematic diagram of an exemplary orthogonal frequency division multiplexing (OFDM) time-frequency grid illustrating at least one resource block (RB)

Before discussing the multi-mode ET amplifier circuit of the present disclosure, a brief overview of an RB-based resource allocation scheme is first provided with reference FIG. 1 to help understand the relationship between bandwidth of an RF signal and the number of RBs allocated to the RF signal. A brief discussion of a conventional ET amplifier circuit for amplifying an RF signal is then provided with reference to FIG. 2. The discussion of specific exemplary aspects of a multi-mode ET amplifier circuit starts below with reference to FIG. 3.

In this regard, FIG. 1 is a schematic diagram of an exemplary orthogonal frequency division multiplexing (OFDM) time-frequency grid 10 illustrating at least one RB 12. The OFDM time-frequency grid 10 includes a frequency axis 14 and a time axis 16. Along the frequency axis 14, there is a plurality of subcarriers 18(1)-18(M). The subcarriers 18(1)-18(M) are orthogonally separated from each other by a frequency spacing Δf of 15 KHz. Along the time axis 16, there is a plurality of OFDM symbols 20(1)-20(N). Each intersection of the subcarriers 18(1)-18M) and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals one-half millisecond (0.5 ms), along the time axis 16. Accordingly, the RB 12 has a bandwidth 24, which equals 180 KHz (15 KHz/subcarrier×12 subcarriers), along the frequency axis 14. In OFDM-based communication systems such as long-term evolution (LTE), the RB 12 is the minimum unit for allocating resources to users.

In an LTE system, an RF signal 26 can occupy multiple subcarriers among the subcarriers 18(1)-18(N). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, an ET amplifier circuit would need to operate fast enough to keep up with the faster amplitude variations of the RF signal 26 across the signal bandwidth 28 within the RB duration 22.

Figure 2:
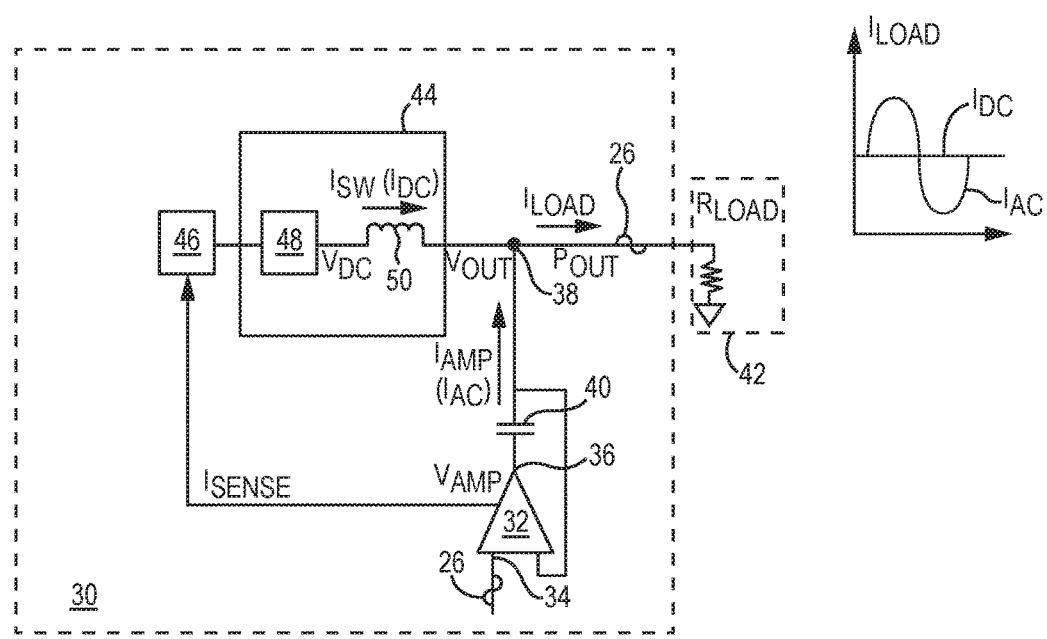
FIG. 2 is a schematic diagram of an exemplary conventional envelope tracking (ET) amplifier circuit including an ET amplifier configured to amplify a radio frequency (RF) signal.

In this regard, FIG. 2 is a schematic diagram of an exemplary conventional ET amplifier circuit 30 including an ET amplifier 32 configured to amplify the RF signal 26 of FIG. 1. Elements of FIG. 1 are referenced in conjunction with FIG. 2 and will not be re-described herein.

The ET amplifier 32 includes an amplifier input 34 and an amplifier output 36. The ET amplifier 32 receives the RF signal 26 via the amplifier input 34 and amplifies the RF signal 26 to an amplified voltage $V_{AMP}$ at the amplifier output 36. The amplifier output 36 is coupled to a signal output 38 via an offset capacitor 40. The offset capacitor 40 is configured to convert the amplified voltage $V_{AMP}$ into an output voltage $V_{OUT}$ at the signal output 38. In a non-limiting example, the output voltage $V_{OUT}$ is one volt (1 V) higher than the amplified voltage $V_{AMP}$.

In the conventional ET amplifier circuit 30, the amplitude variations of the RF signal 26 serve as a target voltage envelope for the output voltage $V_{OUT}$. In this regard, the output voltage $V_{OUT}$ is configured to vary according to the amplitude variations of the RF signal 26. As previously discussed in FIG. 1, the RF signal 26 may have faster amplitude variations within the RB duration 22 when the RF signal 26 contains a higher number of RBs 12 (e.g., more than 25 RBs). As such, the output voltage $V_{OUT}$ needs to change at a faster frequency within the RB duration 22 ($dV_{OUT}/dt$) to keep up with the faster amplitude variations of the RF signal 26.

The conventional ET amplifier circuit 30 is coupled to an RF transmission circuit 42 via the signal output 38 for transmitting the RF signal 26. The RF transmission circuit 42 has a load line $R_{LOAD}$, which induces a load current $I_{LOAD}$ based on the output voltage $V_{OUT}$ ($I_{LOAD}=V_{OUT}\div R_{LOAD}$). The load current $I_{LOAD}$ and the load line $R_{LOAD}$ cause the RF signal 26 to be transmitted from the RF transmission circuit 42 at a determined power $P_{OUT}$ ($P_{OUT}=I_{LOAD}^2\times R_{LOAD}$). The load current $I_{LOAD}$ includes a DC current $I_{DC}$ and an AC current $I_{AC}$. The AC current $I_{AC}$ has an AC current frequency that tracks the variations of the output voltage $V_{OUT}$. In this regard, the AC current frequency is higher when the RF signal 26 contains more than 25 RBs, and is lower when the RF signal 26 contains less than or equal to 25 RBs.

The conventional ET amplifier circuit 30 includes switcher circuitry 44 and a control circuit 46 configured to control the switcher circuitry 44. The switcher circuitry 44 includes a DC-DC converter 48 and an inductor 50. The DC-DC converter 48 is configured to generate a DC voltage $V_{DC}$. The inductor 50, which can have an inductance L between 1.1 microHenry (1.1 μH) and 2.2 μH for example, induces a switcher current $I_{SW}$. The switcher current $I_{SW}$ has a switcher current frequency $dI_{SW}/dt$ that can be determined based on the equation (Eq. 1) below.

$$dI_{SW}/dt=(V_{DC}-V_{out})/L \qquad \text{(Eq. 1)}$$

As can be seen from the equation (Eq. 1) above, the switcher current frequency $dI_{sw}/dt$ is inversely related to the inductance L of the inductor 50. Given that the inductance L of the inductor 50 needs to be large enough to help reduce noise degradation, the switcher current frequency $dI_{SW}/dt$ may not be fast enough to keep up with the variations of the output voltage $V_{OUT}$ when the RF signal 26 contains more than 25 RBs. As such, the switcher circuitry 44 would only be able to provide the switcher current $I_{SW}$ as the DC current $I_{DC}$ in the load current $I_{LOAD}$. Consequently, the ET amplifier 32 will be forced to supply an amplifier current $I_{AMP}$ to function as the AC current $I_{AC}$ in the load current $I_{LOAD}$, thus compromising efficiency of the ET amplifier 32.

The ET amplifier 32 provides a sense current $I_{SENSE}$, which is proportional to the amplifier current $I_mp$, to the control circuit 46. The control circuit 46 relies on the sense current $I_{SENSE}$ to detect the amplifier current $I_{AMP}$ generated by the ET amplifier 32, and controls the switcher circuitry 44 to adjust the switcher current $I_{SW}$ in an effort to minimize the amplifier current $I_{AMP}$. In this regard, when the ET amplifier 32 increases the amplifier current $I_{AMP}$, the sense current $I_{SENSE}$ would also increase proportionally. The increased sense current $I_{SENSE}$ can cause parasitic capacitance to increase in field-effect transistors (FETs) contained in the switcher circuitry 44, thus further reducing the efficiency of the switcher circuitry 44. In this regard, it may be desired to minimize the amplifier current $I_{AMP}$ generated by the ET amplifier 32 under all operating conditions, especially when the RF signal 26 contains more than 25 RBs.

Figure 3:
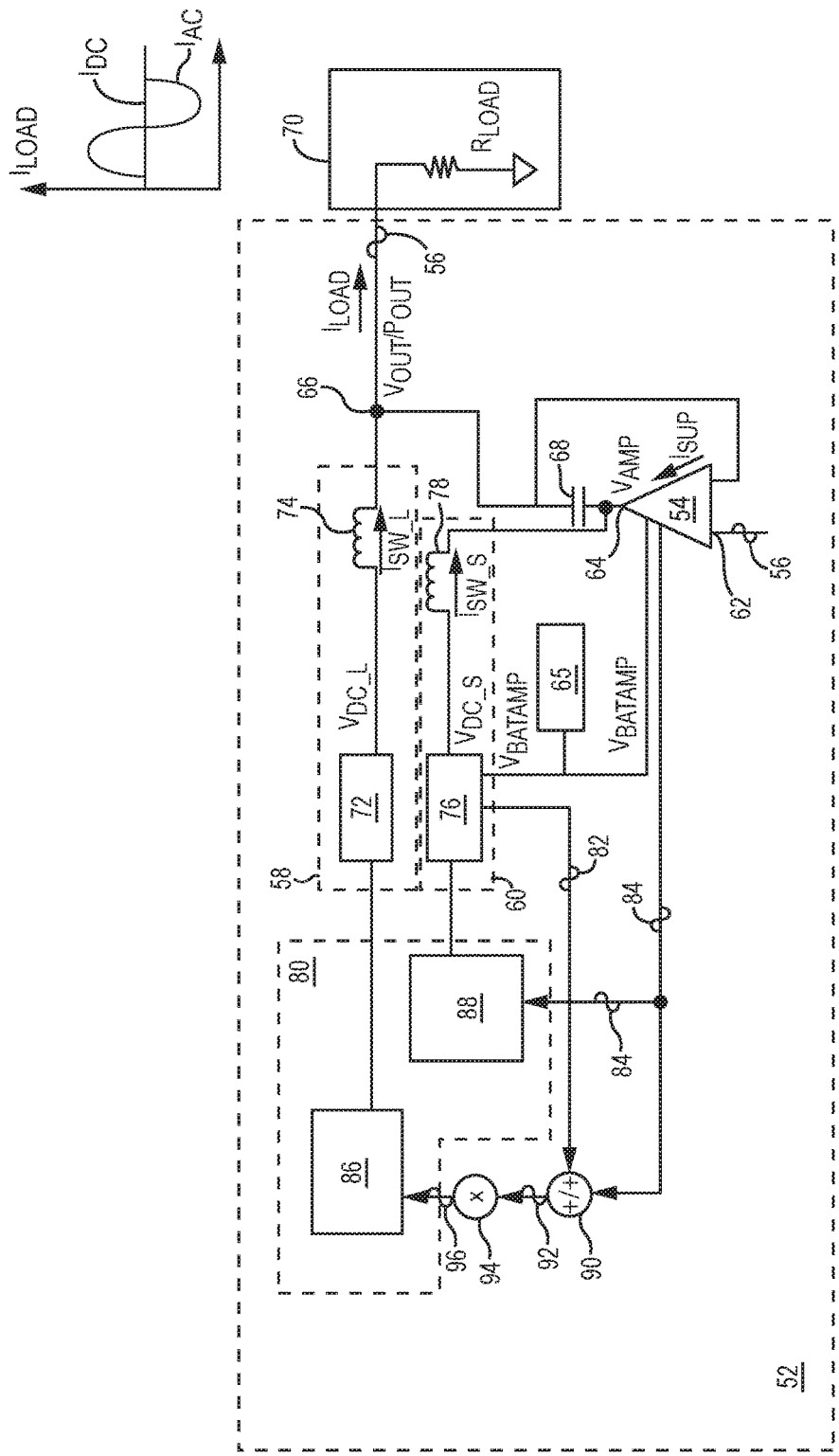
FIG. 3 is a schematic diagram of an exemplary multi-mode ET amplifier circuit including at least one ET amplifier configured to amplify an RF signal with improved efficiency over the ET amplifier of FIG. 2.

In this regard, FIG. 3 is a schematic diagram of an exemplary multi-mode ET amplifier circuit 52 including at least one ET amplifier 54 configured to amplify an RF signal 56 with improved efficiency over the ET amplifier 32 of FIG. 2. The multi-mode ET amplifier circuit 52 is configured to operate in a low-RB mode and a high-RB mode with improved efficiency over the conventional ET amplifier circuit 30. In a non-limiting example, the RF signal 56 includes less than or equal to 25 RBs (≤25 RBs) in the low-RB mode and more than 25 RBs (>25 RBs) in the high-RB mode. Accordingly, the respective bandwidth of the RF signal 56 will be less than or equal to 4.5 MHz (≤4.5 MHz) in the low-RB mode and greater than 4.5 MHz in the high-RB mode. In another non-limiting example, the multi-mode ET amplifier circuit 52 can be referred to as operating in an ultra-high-RB mode when the RF signal 56 includes more than 200 RBs and has the respective bandwidth of more than 36 MHz.

The multi-mode ET amplifier circuit 52 includes low-RB switcher circuitry 58, which is functionally equivalent to the switcher circuitry 44 in FIG. 2, and high-RB switcher circuitry 60. As is further discussed below, the high-RB switcher circuitry 60 can be activated in the high-RB mode to help minimize AC current supplied by the ET amplifier 54, thus improving operating efficiency of the ET amplifier 54 and the multi-mode ET amplifier circuit 52 as a whole.

The ET amplifier 54, which can be functionally equivalent to the ET amplifier 32 of FIG. 2, includes an amplifier input 62 and an amplifier output 64. The ET amplifier 54 receives the RF signal 56 via the amplifier input 62 and amplifies the RF signal 56 to an amplified voltage $V_{AMP}$ at the amplifier output 64 based on a supply voltage $V_{BATAMP}$. In a non-limiting example, the supply voltage $V_{BATAMP}$ can be provided by an inductor-based buck-boost circuit 65. The amplifier output 64 is coupled to a signal output 66 via an offset capacitor 68. The offset capacitor 68 is configured to convert the amplified voltage $V_{AMP}$ to an output voltage $V_{OUT}$ at the signal output 66. In a non-limiting example, the output voltage $V_{OUT}$ is 1 V higher than the amplified voltage $V_{AMP}$.

In the multi-mode ET amplifier circuit 52, amplitude variations of the RF signal 56 serve as a target voltage envelope for the output voltage $V_{OUT}$. In this regard, the output voltage $V_{OUT}$ is configured to vary according to the amplitude variations of the RF signal 56 at the signal output 66. The multi-mode ET amplifier circuit 52 is coupled to an RF transmission circuit 70 via the signal output 66 for transmitting the RF signal 56 at a determined power $P_{OUT}$. The RF transmission circuit 70 has a load line $R_{LOAD}$, which induces a load current $I_{LOAD}$ based on the output voltage $V_{OUT}$ ($I_{LOAD}=V_{OUT}\div R_{LOAD}$). The load current $I_{LOAD}$ and the load line $R_{LOAD}$ cause the RF signal 56 to be transmitted from the RF transmission circuit 70 at the determined power $P_{OUT}$ ($P_{OUT}=I_{LOAD}^2 \times R_{LOAD}$). As previously discussed in FIG. 2, the load current $I_{LOAD}$ includes the DC current $I_{DC}$ and the AC current $I_{AC}$.

The low-RB switcher circuitry 58 includes a first DC-DC converter 72 and a first inductor 74. The first DC-DC converter 72 is configured to generate a first DC voltage $V_{DC\_L}$. The first inductor 74, which can have a first inductance $L_{SW\_L}$ between 1.1 μH and 2.2 μH for example, induces a DC current $I_{SW\_L}$. The high-RB switcher circuitry 60 includes a second DC-DC converter 76 and a second inductor 78. The second DC-DC converter 76 is configured to generate a second DC voltage $V_{DC\_S}$ based on the supply voltage $V_{BATAMP}$ supplied by the inductor-based buck-boost circuit 65. The second inductor 78, which can have a second inductance $L_{SW\_S}$ between 100 nanoHenry (nH) and 200 nH for example, induces an AC current $I_{SW\_S}$. According to the equation (Eq. 1) above, a first switcher current frequency $dI_{SW\_L}/dt$ of the first inductor 74 and a second switcher current frequency $dI_{SW\_S}/dt$ of the second inductor 78 are inversely related to the first inductance $L_{SW\_L}$ and the second inductance $L_{SW\_S}$, respectively. As such, since the second inductance $L_{SW\_S}$ is substantially smaller than the first inductance $L_{SW\_L}$, the high-RB switcher circuitry 60 can support the second switcher current frequency $dI_{SW\_S}/dt$ faster than the first switcher current frequency $dI_{SW\_L}/dt$ of the low-RB switcher circuitry 58. As a result, the high-RB switcher circuitry 60 is able to provide the AC current $I_{SW\_S}$, which is provided to the signal output 66 by the offset capacitor 68, as the AC current $I_{AC}$ in the load current $I_{LOAD}$ when the multi-mode ET amplifier circuit 52 is operating in the high-RB mode, thus helping to minimize the AC current supplied by the ET amplifier 54 to improve the operating efficiency of the ET amplifier 54.

The multi-mode ET amplifier circuit 52 includes at least one control circuit 80. The control circuit 80 is configured to activate the low-RB switcher circuitry 58 in the low-RB mode and the high-RB mode to provide the DC current $I_{SW\_L}$ to the signal output 66 as the DC current $I_{DC}$. The control circuit 80 is further configured to activate the high-RB switcher circuitry 60 in the high-RB mode to provide the AC current $I_{SW\_S}$ to the amplifier output 64 and subsequently to the signal output 66 as the AC current $I_{AC}$. When the multi-mode ET amplifier circuit 52 is operating in the low-RB mode, the control circuit 80 is configured to deactivate the high-RB switcher circuitry 60. As previously discussed in FIG. 2, the ET amplifier 32 of FIG. 2 would be forced to generate the AC current $I_{AC}$ when the RF signal 26 includes the higher number of RBs 12. As such, the control circuit 80 can be configured to activate or deactivate the high-RB switcher circuitry 60 based on whether the ET amplifier 54 is forced to generate the AC current $I_{AC}$. Specifically, the control circuit 80 may activate the high-RB switcher circuitry 60 or keep the high-RB switcher circuitry 60 activated in response to determining that the ET amplifier 54 is supplying the AC current $I_{AC}$. The control circuit 80 may deactivate the high-RB switcher circuitry 60 in response to determining that the ET amplifier 54 is sinking the AC current $I_{AC}$.

Given that the amplitude variations of the RF signal 56 can be slower in the low-RB mode as opposed to being faster in the high-RB mode, the low-RB switcher circuitry 58 may be able to supply the AC current $I_{AC}$ in the low-RB mode in addition to supplying the DC current $I_{DC}$. As such, the control circuit 80 may control the low-RB switcher circuitry 58 to provide the AC current $I_{AC}$ to the signal output 66, thus helping to minimize the AC current $I_{AC}$ supplied by the ET amplifier 54, which further helps to improve the operating efficiency of the ET amplifier 54 in the low-RB mode.

In one exemplary aspect, the second DC-DC converter 76 in the high-RB switcher circuitry 60 can be configured to generate the second DC voltage $V_{DC\_S}$ in a first voltage level or a second voltage level higher than the first voltage level. Accordingly, the AC current $I_{SW\_S}$ will be lower when the second DC voltage $V_{DC\_S}$ is at the first voltage level, or higher when the second DC voltage $V_{DC\_S}$ is at the second voltage level. As such, the AC current $I_{SW\_S}$ supplied by the high-RB switcher circuitry 60 may be insufficient to cause the RF signal 56 to be transmitted from the signal output 66 at the determined power $P_{OUT}$ under such operational conditions as in the ultra-high-RB mode. Consequently, the ET amplifier 54 would need to provide a supplemental AC current $I_{SUP}$ to the signal output 66 to make up for the deficiency of the AC current $I_{SW\_S}$. As a result, the AC current $I_{AC}$ in the load current $I_{LOAD}$ would include the AC current $I_{SW\_S}$ supplied by the high-RB switcher circuitry 60 and the supplemental AC current $I_{SUP}$ provided by the ET amplifier 54 ($I_{AC}=I_{SW\_S}+I_{SUP}$).

In contrast, under certain circumstances, the AC current $I_{SW\_S}$ generated by the high-RB switcher circuitry 60 may be more that what is needed to cause the RF signal 56 to be transmitted from the signal output 66 at the determined power $P_{OUT}$. As such, the ET amplifier 54 can be configured to sink at least a portion of the AC current $I_{AC}$ that is excessive for transmitting the RF signal 56 at the determined power $P_{OUT}$. The high-RB switcher circuitry 60 can be configured to generate a switcher sense current 82 that is in proportion to the AC current $I_{SW\_S}$ generated by the high-RB switcher circuitry 60. Likewise, the ET amplifier 54 can be configured to generate an amplifier sense current 84 that is in proportion to the supplemental AC current $I_{SUP}$ generated by the ET amplifier 54. In this regard, the amplifier sense current 84 may be a positive current when the ET amplifier 54 is providing the supplemental AC current $I_{SUP}$. In contrast, the amplifier sense current 84 may be a negative current when the ET amplifier 54 is sinking the portion of the AC current $I_{AC}$. As is discussed below, the switcher sense current 82 and the amplifier sense current 84 can be utilized by the control circuit 80 to control the low-RB switcher circuitry 58 and the high-RB switcher circuitry 60 in the low-RB mode and the high-RB mode.

In another exemplary aspect, the control circuit 80 can be implemented based on a low-RB control circuit 86 and a high-RB control circuit 88. The low-RB control circuit 86 is coupled to the low-RB switcher circuitry 58 and is configured to activate the low-RB switcher circuitry 58 in the low-RB mode and the high-RB mode. The high-RB control circuit 88 is coupled to the high-RB switcher circuitry 60 and is configured to activate the high-RB switcher circuitry 60 in the high-RB mode and deactivate the high-RB switcher circuitry 60 in the low-RB mode. In a non-limiting example, the low-RB control circuit 86 can be enabled by a bang-bang controller (BBC) or a pulse-width modulation (PWM) controller, and the high-RB control circuit 88 can be enabled by a BBC.

As previously mentioned, the control circuit 80 can be configured to activate or deactivate the high-RB switcher circuitry 60 based on whether the ET amplifier 54 is forced to generate the AC current $I_{AC}$. In this regard, the high-RB control circuit 88 can be configured to activate or deactivate the high-RB switcher circuitry 60 based on whether the ET amplifier 54 is forced to generate the AC current $I_{AC}$. In a non-limiting example, the high-RB control circuit 88 receives the amplifier sense current 84 from the ET amplifier 54. The high-RB control circuit 88 can activate the high-RB switcher circuitry 60 or control the high-RB switcher circuitry 60 to increase the AC current $I_{SW\_S}$ in response to the amplifier sense current 84 being the positive current. In contrast, the high-RB control circuit 88 can control the high-RB switcher circuitry 60 to decrease the AC current $I_{SW\_S}$ or deactivate the high-RB switcher circuitry 60 in response to the amplifier sense current 84 being the negative current. In this regard, the high-RB control circuit 88 can first control the second DC-DC converter 76 to produce the second DC voltage $V_{DC\_S}$ at the first voltage level, thus causing the AC current $I_{SW\_S}$ to decrease. If the amplifier sense current 84 remains negative after decreasing the AC current $I_{SW\_S}$, the high-RB control circuit 88 may conclude that the multi-mode ET amplifier circuit 52 needs to operate in the low-RB mode, and thus deactivates the high-RB switcher circuitry 60.

The low-RB control circuit 86 is configured to receive the switcher sense current 82 and the amplifier sense current 84 from the high-RB switcher circuitry 60 and the ET amplifier 54, respectively. As discussed below, the low-RB control circuit 86 controls the low-RB switcher circuitry 58 to adjust the DC current $I_{SW\_L}$ based on the switcher sense current 82 and the amplifier sense current 84.

The multi-mode ET amplifier circuit 52 includes a current combiner 90 configured to receive and combine the switcher sense current 82 and the amplifier sense current 84 to generate a combined sense current 92. The multi-mode ET amplifier circuit 52 also includes a gain regulator 94 provided between the current combiner 90 and the low-RB control circuit 86. The gain regulator 94 receives the combined sense current 92 from the current combiner 90 and scales the combined sense current 92 based on a scaling factor to generate a scaled sense current 96. The gain regulator 94 is further configured to provide the scaled sense current 96 to the low-RB control circuit 86 for controlling the low-RB switcher circuitry 58. As previously discussed, the first switcher current frequency $dI_{SW\_L}/dt$ of the first inductor 74 is inversely related to the first inductance $L_{SW\_L}$. In this regard, the smaller the first inductance $L_{SW\_L}$, the smaller the supplemental AC current $I_{SUP}$, and accordingly, the smaller the amplifier sense current 84. In contrast, the larger the first inductance $L_{SW\_L}$, the larger the supplemental AC current $I_{SUP}$, and accordingly, the larger the amplifier sense current 84. As such, the amplifier sense current 84 can indirectly reflect the first inductance $L_{SW\_L}$ of the first inductor 74 and the DC current $I_{SW\_L}$ generated by the low-RB switcher circuitry 58. As such, it may be possible to configure the scaling factor of the gain regulator 94 based on the first inductance $L_{SW\_L}$ of the first inductor 74 and/or the amount of the DC current $I_{SW\_L}$ generated by the low-RB switcher circuitry 58.

The gain regulator 94 is provided to keep the amount of the combined sense current 92 relatively stable between the low-RB mode and the high-RB mode. In a non-limiting example, the scaling factor is set to one in the low-RB mode and less than one in the high-RB mode. In a non-limiting example, the scaling factor can be greater than $\frac{1}{30}$ and less than one in the high-RB mode, and less than $\frac{1}{30}$ in the ultra-high-RB mode. The scaling factor can be set to one in the low-RB mode, because the combined sense current 92 would be smaller as a result of the high-RB switcher circuitry 60 being deactivated and the switcher sense current 82 being eliminated. In contrast, in the high-RB mode, the combined sense current 92 would be higher as a result of the high-RB switcher circuitry 60 being activated. Thus, by setting the scaling factor to be less than one, it is possible to scale down the amount of the combined sense current 92 in the high-RB mode. As a result, the low-RB switcher circuitry 58 can include less and smaller FETs (e.g., with thinner dielectric layer), thus helping to reduce parasitic capacitance in the low-RB switcher circuitry 58. In addition, by scaling down the amount of the combined sense current 92 in the high-RB mode, the low-RB switcher circuitry 58 can operate at a lowest possible switching frequency. The combination of reduced parasitic capacitance and lowered switching frequency allows the low-RB switcher circuitry 58 to operate at a higher efficiency.

In a non-limiting example, the low-RB control circuit 86 can determine the amount of the load current $I_{LOAD}$ at the signal output 66 based on the scaled sense current 96 (e.g., based on a look-up table). As such, the low-RB control circuit 86 can control the first DC-DC converter 72 to adjust the first DC voltage $V_{DC\_L}$ to increase or decrease the DC current $I_{SW\_L}$, thus helping to maintain the determined power $P_{OUT}$ of the RF signal 56 at the signal output 66.

Alternative to controlling the low-RB switcher circuitry 58 based on the switcher sense current 82 and the amplifier sense current 84, the low-RB control circuit 86 may be configured to control the low-RB switcher circuitry 58 based on the output voltage $V_{OUT}$ of the RF signal 56 at the signal output 66. As previously discussed, the determined power $P_{OUT}$ of the RF signal 56 is a function of the load current $I_{LOAD}$ and the output voltage $V_{OUT}$ at the signal output 66 ($P_{OUT}=I_{LOAD}\times V_{OUT}$). As such, by monitoring the output voltage $V_{OUT}$, the low-RB control circuit 86 can determine whether the output voltage $V_{OUT}$ is sufficient to cause the RF signal 56 to be transmitted at the determined power $P_{OUT}$. Accordingly, the low-RB control circuit 86 can control the low-RB switcher circuitry 58 to increase or decrease the first DC voltage $V_{DC\_L}$ to adjust the DC current $I_{SW\_L}$, thus impacting the determined power $P_{OUT}$ at the signal output 66. Specifically, the low-RB control circuit 86 can control the low-RB switcher circuitry 58 to increase the DC current $I_{SW\_L}$ when the output voltage $V_{OUT}$ is insufficient to cause the RF signal 56 to be transmitted at the determined power $P_{OUT}$ from the signal output 66. By adjusting the DC current $I_{SW\_L}$ based on monitoring the output voltage $V_{OUT}$, the low-RB switcher circuitry 58 may operate at 1 to 3 MHz switching frequency in both the low-RB mode and the high-RB mode, thus helping to improve operating efficiency of the low-RB switcher circuitry 58.

As previously discussed, the amplitude variations of the RF signal 56 serve as the target voltage envelope for the output voltage $V_{OUT}$. In this regard, the output voltage $V_{OUT}$ is configured to vary according to the amplitude variations of the RF signal 56 at the signal output 66. Accordingly, the AC current $I_{SW\_S}$ also needs to vary according to the amplitude variations of the RF signal 56 to maximize operating efficiency of the multi-mode ET amplifier circuit 52. However, active components (e.g., FETs, switching drivers, switches, and inductors) in the high-RB control circuit 88 and the high-RB switcher circuitry 60 can introduce delays in the AC current $I_{SW\_S}$. For example, in the ultra-high-RB mode where the RF signal 56 includes more than 200 RBs, the AC current $I_{SW\_S}$ can be delayed by approximately one to two nanoseconds (1-2 ns), which can cause the multi-mode ET amplifier circuit 52 to lose two to three percent (2-3%) of efficiency. Hence, it may be desired to provide a timing advance in the AC current $I_{SW\_S}$ to mitigate the delay resulting from the high-RB control circuit 88 and the high-RB switcher circuitry 60.

Figure 4:
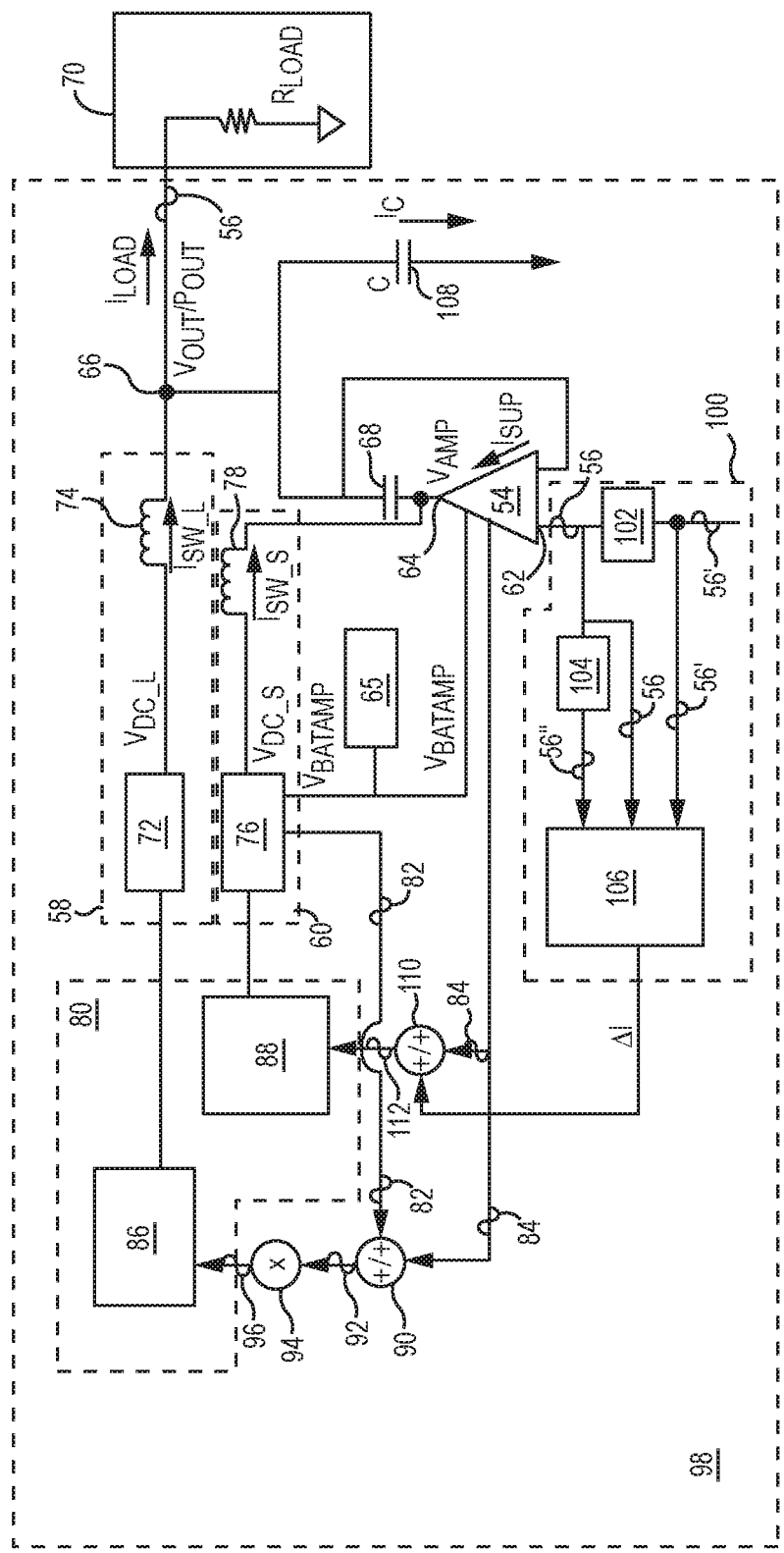
FIG. 4 is a schematic diagram of an exemplary multi-mode ET amplifier circuit including delay compensation circuitry configured to mitigate processing delay in the multi-mode ET amplifier circuit of FIG. 3.

In this regard, FIG. 4 is a schematic diagram of an exemplary multi-mode ET amplifier circuit 98 including delay compensation circuitry 100 configured to mitigate processing delay in the high-RB control circuit 88 and the high-RB switcher circuitry 60 of FIG. 3. Common elements between FIGS. 3 and 4 are shown therein with common element numbers and will not be re-described herein.

The delay compensation circuitry 100 is coupled to the ET amplifier 54 and the high-RB control circuit 88. The delay compensation circuitry 100 is configured to provide a timing advance in the AC current $I_{SW\_S}$ by delaying the RF signal 56, thus compensating for the processing delay associated with the high-RB switcher circuitry 60 in the high-RB mode. In a non-limiting example, the delay compensation circuitry 100 is configured to delay the RF signal 56 by an estimated processing delay dT (e.g., 1-2 ns) associated with the high-RB control circuit 88 and the high-RB switcher circuitry 60.

At any determined time t, the delay compensation circuitry 100 receives an advanced RF signal 56' that represents the RF signal 56 at time t+dT. In this regard, the advanced RF signal 56' is a forward-looking sample of the RF signal 56 at the time t+dT. The delay compensation circuitry 100 includes first delay circuitry 102 configured to delay the advanced RF signal 56' by the estimated processing delay dT to generate the RF signal 56. The delay compensation circuitry 100 includes second delay circuitry 104 configured to delay the RF signal 56 by the estimated processing delay dT to generate a delayed RF signal 56". In this regard, the delayed RF signal 56" is a backward-looking sample of the RF signal 56 at the time t−dT.

The delay compensation circuitry 100 also includes current adjustment circuitry 106. The current adjustment circuitry 106 generates a differential current ΔI indicative of an estimated current change at the determined time t. In a non-limiting example, the current adjustment circuitry 106 determines the differential current ΔI based on the equations (Eq. 2.1, Eq. 2.2, and Eq. 2.3) below.

$$\Delta I_C = C/dT \times [V_{OUT}(t-dT) - 2V_{OUT}(t+dT)] \qquad \text{(Eq. 2.1)}$$

$$\Delta I_{LOAD} = 1/R_{LOAD} \times [V_{OUT}(t+dT) - V_{OUT}(t)] \qquad \text{(Eq. 2.2)}$$

$$\Delta I = \Delta I_C + \Delta I_{LOAD} \qquad \text{(Eq. 2.3)}$$

In Eq. 2.1 $\Delta I_C$ represents an estimated current change relative to a bypass capacitor 108, and C represents total load capacitance of the RF transmission circuit 70. $V_{OUT}(t-dT)$, $V_{OUT}(t)$, and $V_{OUT}(t+dT)$ represent estimates of the output voltage $V_{OUT}$ at times t−dT, t, and t+dT, respectively. In Eq. 2.2, $\Delta I_{LOAD}$ represents an estimated current change relative to the load line $R_{LOAD}$ for the duration between t−dT and t+dT. In a non-limiting example, the total load capacitance C is typically known and does not change for a given design of the RF transmission circuit 70. The load line $R_{LOAD}$, on the other hand, will change from time to time to adapt to voltage standing wave ratio (VSWR) changes of the ET amplifier 54. In a non-limiting example, the load line $R_{LOAD}$ can be determined based on a look-up table (LUT) of the ET amplifier 54.

The multi-mode ET amplifier circuit 98 includes a second combiner 110. The second combiner 110 combines the differential current ΔI with the amplifier sense current 84 to generate a delay-compensated sense current 112, and provide the delay-compensated sense current 112 to the high-RB control circuit 88. The high-RB control circuit 88 is configured to control the high-RB switcher circuitry 60 based on the delay-compensated sense current 112 to minimize the processing delay in the AC current $I_{SW\_S}$, thus helping to further improve the efficiency of the multi-mode ET amplifier circuit 98.

Figure 5A:
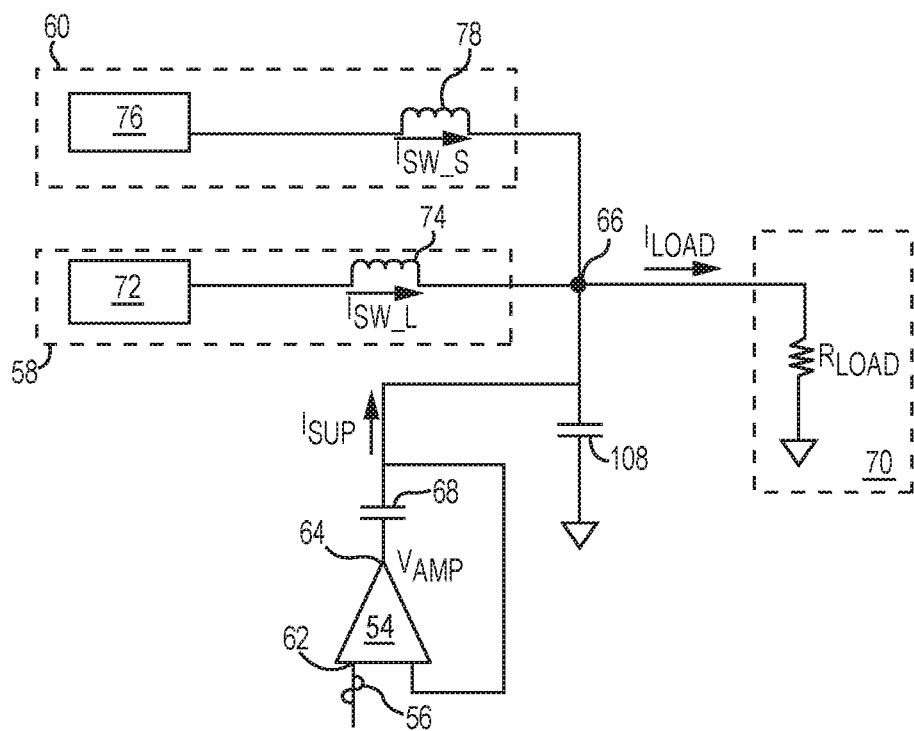
FIGS. 5A and 5B are schematic diagrams providing exemplary illustrations of alternative implementations of the multi-mode ET amplifier circuit of FIG. 3.
Figure 5B:
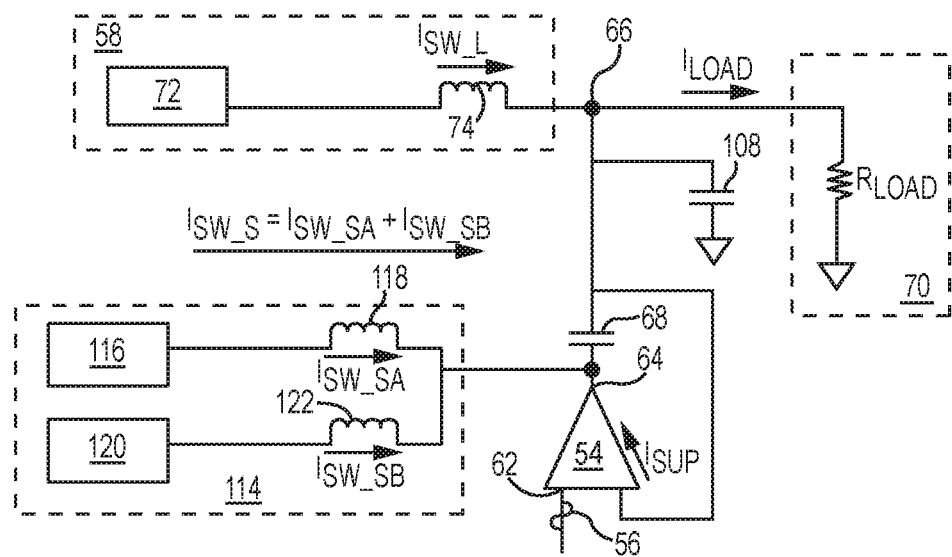

Notably, the high-RB switcher circuitry 60 as described in FIGS. 3 and 4 is one of many possible implementations in the multi-mode ET amplifier circuit 52 of FIG. 3. In this regard, FIGS. 5A and 5B are schematic diagrams providing exemplary illustrations of alternative implementations of the high-RB switcher circuitry 60 in the multi-mode ET amplifier circuit 52 of FIG. 3. Common elements between FIGS. 3, 5A, and 5B are shown therein with common element numbers and will not be re-described herein.

With reference to FIG. 5A, the high-RB switcher circuitry 60 can be configured to provide the AC current $I_{SW\_S}$ directly to the signal output 66, as opposed to providing the AC current $I_{SW\_S}$ to the amplifier output 64.

With reference to FIG. 5B, it is possible to replace the high-RB switcher circuitry 60 of FIG. 3 with dual-phase switcher circuitry 114. As shown in FIG. 5B, the dual-phase switcher circuitry 114 includes a first phase DC-DC converter 116 coupled to a first phase inductor 118 and a second phase DC-DC converter 120 coupled to a second phase inductor 122. The first phase inductor 118 induces a first phase AC current $I_{SW\_SA}$. The second phase inductor 122 induces a second phase AC current $I_{SW\_SB}$. Accordingly, the AC current $I_{SW\_S}$ generated by the dual-phase switcher circuitry 114 equals a sum of the first phase AC current $I_{SW\_SA}$ and the second phase AC current $I_{SW\_S}=I_{SW\_SA}+I_{SW\_SB}$).

The dual-phase switcher circuitry 114 can provide additional performance to the multi-mode ET amplifier circuit 52 of FIG. 3. In one example, the dual-phase switcher circuitry 114 doubles equivalent bandwidth of the high-RB switcher circuitry 60 of FIG. 3. In another example, the dual-phase switcher circuitry 114 can help reduce ripple and support charge redistribution for improved efficiency of the multi-mode ET amplifier circuit 52.

It shall be appreciated that it is possible to further improve the operating efficiency of the multi-mode ET amplifier circuit 52 of FIG. 3 based on a variety of techniques. In one non-limiting example, it is possible to provide the ET amplifier 54 and the high-RB switcher circuitry 60 in a first process node, while providing the low-RB switcher circuitry 58 in a second process node. The first process node may be based on 0.13 micrometer (0.13 μm) silicon on insulator (SOI) or 90 nanometer (90 nm) process. The second process node may be based on 0.5 μm SOI or 0.18 nm process. The first process node can be much faster than the second process node and requires less voltage handling than the second process node.

In another non-limiting example, it is possible to reduce output stage size in the RF transmission circuit 70 for transmitting the RF signal 56 in the high-RB mode. For example, it may be possible to configure the RF transmission circuit 70 to only transmit the RF signal 56 in the high-RB mode while relocating circuitry and/or active components associated with transmitting the RF signal 56 in the low-RB mode to a separate RF transmission circuit. By reducing the output stage size in the RF transmission circuit 70, it may be possible to further improve the operating efficiency of the multi-mode ET amplifier circuit 52.

Those skilled in the art will recognize improvements and modifications to the embodiments of the present disclosure. All such improvements and modifications are considered within the scope of the concepts disclosed herein and the claims that follow.

What is claimed is:

1. A multi-mode envelope tracking (ET) amplifier circuit configured to operate in a low-resource block (RB) mode and a high-RB mode, comprising:
    a signal output coupled to a radio frequency (RF) transmission circuit for transmitting an RF signal at a determined power;
    at least one ET amplifier comprising an amplifier input configured to receive the RF signal and an amplifier output coupled to the signal output, the at least one ET amplifier configured to amplify the RF signal to an amplified voltage at the amplifier output based on a supply voltage;
    low-RB switcher circuitry configured to generate a direct current (DC) current;
    high-RB switcher circuitry configured to generate an alternating current (AC) current; and
    at least one control circuit configured to:
        activate the low-RB switcher circuitry in the low-RB mode and the high-RB mode to provide the DC current to the signal output;
        activate the high-RB switcher circuitry in the high-RB mode to provide the AC current to the amplifier output; and
        deactivate the high-RB switcher circuitry in the low-RB mode.

2. The multi-mode ET amplifier circuit of claim 1, wherein the at least one control circuit is configured to:
    activate the high-RB switcher circuitry in response to determining that the at least one ET amplifier is supplying the AC current; and
    deactivate the high-RB switcher circuitry in response to determining that the at least one ET amplifier is sinking the AC current.

3. The multi-mode ET amplifier circuit of claim 1, wherein:
    in the low-RB mode, the RF signal comprises less than or equal to twenty-five RBs; and
    in the high-RB mode, the RF signal comprises more than twenty-five RBs.

4. The multi-mode ET amplifier circuit of claim 1, wherein:
    the low-RB switcher circuitry comprises a first DC-DC converter and a first inductor having a first inductance; and
    the high-RB switcher circuitry comprises a second DC-DC converter and a second inductor having a second inductance substantially smaller than the first inductance.

5. The multi-mode ET amplifier circuit of claim 4, further comprising an offset capacitor configured to:
    couple the amplifier output of the at least one ET amplifier to the signal output;
    convert the amplified voltage at the amplifier output to an output voltage higher than the amplified voltage at the signal output; and provide the AC current from the amplifier output to the signal output.

6. The multi-mode ET amplifier circuit of claim 5, wherein the at least one control circuit comprises:
a low-RB control circuit coupled to the low-RB switcher circuitry and configured to activate the low-RB switcher circuitry in the low-RB mode and the high-RB mode; and
a high-RB control circuit coupled to the high-RB switcher circuitry and configured to activate the high-RB switcher circuitry in the high-RB mode and deactivate the high-RB switcher circuitry in the low-RB mode.

7. The multi-mode ET amplifier circuit of claim 6, wherein the low-RB control circuit and the high-RB control circuit are each provided as a bang-bang controller (BBC).

8. The multi-mode ET amplifier circuit of claim 6, wherein the low-RB control circuit is provided as a pulse-width modulation (PWM) controller.

9. The multi-mode ET amplifier circuit of claim 6, wherein the output voltage, the DC current, and the AC current are configured to cause the RF signal to be transmitted at the determined power from the signal output.

10. The multi-mode ET amplifier circuit of claim 9, wherein the at least one ET amplifier is further configured to:
provide a supplemental AC current to the signal output when the AC current is insufficient to cause the RF signal to be transmitted at the determined power from the signal output; and
sink a portion of the AC current when the AC current is excessive to cause the RF signal to be transmitted at the determined power from the signal output.

11. The multi-mode ET amplifier circuit of claim 10, wherein:
the high-RB switcher circuitry is further configured to generate a switcher sense current in proportion to the AC current generated by the high-RB switcher circuitry; and
the at least one ET amplifier is further configured to generate an amplifier sense current in proportion to the supplemental AC current generated by the at least one ET amplifier, wherein:
the amplifier sense current is a positive current when the at least one ET amplifier is providing the supplemental AC current; and
the amplifier sense current is a negative current when the at least one ET amplifier is sinking the portion of the AC current.

12. The multi-mode ET amplifier circuit of claim 11, wherein the high-RB control circuit is further configured to:
receive the amplifier sense current from the at least one ET amplifier;
control the high-RB switcher circuitry to increase the AC current in response to the amplifier sense current being the positive current; and
control the high-RB switcher circuitry to reduce the AC current in response to the amplifier sense current being the negative current.

13. The multi-mode ET amplifier circuit of claim 11, wherein the low-RB control circuit is further configured to:
receive the amplifier sense current from the at least one ET amplifier;
receive the switcher sense current from the high-RB switcher circuitry; and
control the low-RB switcher circuitry to adjust the DC current based on the switcher sense current and the amplifier sense current.

14. The multi-mode ET amplifier circuit of claim 13, further comprising:
a current combiner configured to receive and combine the amplifier sense current and the switcher sense current to generate a combined sense current; and
a gain regulator configured to:
receive the combined sense current from the current combiner;
scale the combined sense current based on a scaling factor to generate a scaled sense current; and
provide the scaled sense current to the low-RB control circuit;
wherein the low-RB control circuit is further configured to control the low-RB switcher circuitry based on the scaled sense current.

15. The multi-mode ET amplifier circuit of claim 14, wherein the scaling factor is equal to one in the low-RB mode and is equal to less than one in the high-RB mode.

16. The multi-mode ET amplifier circuit of claim 14, wherein the scaling factor is determined in relation to the first inductance of the first inductor and/or the DC current generated by the low-RB switcher circuitry.

17. The multi-mode ET amplifier circuit of claim 11, wherein the low-RB control circuit is further configured to:
monitor the output voltage at the signal output to determine whether the output voltage is sufficient to cause the RF signal to be transmitted at the determined power from the signal output; and
control the low-RB switcher circuitry to increase the DC current when the output voltage is insufficient to cause the RF signal to be transmitted at the determined power from the signal output.

18. The multi-mode ET amplifier circuit of claim 11, further comprising delay compensation circuitry coupled to the at least one ET amplifier and the high-RB control circuit, the delay compensation circuitry configured to delay the RF signal to compensate for a processing delay associated with the high-RB switcher circuitry in the high-RB mode.

19. The multi-mode ET amplifier circuit of claim 18, wherein:
the delay compensation circuitry is further configured to generate a differential current indicative of an estimated current change at a determined time; and
the high-RB control circuit is further configured to control the high-RB switcher circuitry based on the differential current.

20. The multi-mode ET amplifier circuit of claim 1, wherein in the low-RB mode, the low-RB switcher circuitry is further configured to provide the AC current to the signal output.

21. The multi-mode ET amplifier circuit of claim 1, wherein in the high-RB mode, the high-RB switcher circuitry is further configured to operate based on the supply voltage of the at least one ET amplifier.

* * * * *